(12) United States Patent
Park

(10) Patent No.: US 9,373,373 B2
(45) Date of Patent: Jun. 21, 2016

(54) STACK TYPE SEMICONDUCTOR APPARATUS

(71) Applicant: SK hynix Inc., Icheon-si, Gyeonggi-do (KR)

(72) Inventor: Heat Bit Park, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 52 days.

(21) Appl. No.: 14/562,992

(22) Filed: Dec. 8, 2014

(65) Prior Publication Data

US 2016/0071562 A1    Mar. 10, 2016

(30) Foreign Application Priority Data

Sep. 5, 2014 (KR) .................. 10-2014-0118848

(51) Int. Cl.
*G11C 7/10* (2006.01)
*G11C 7/22* (2006.01)
*G11C 5/02* (2006.01)

(52) U.S. Cl.
CPC .. *G11C 7/22* (2013.01); *G11C 5/02* (2013.01); *G11C 7/106* (2013.01)

(58) Field of Classification Search
CPC .......... G11C 5/147; G11C 5/145; G11C 7/22; G11C 7/1066
USPC .............................................. 365/189.05, 193
See application file for complete search history.

(56) References Cited

U.S. PATENT DOCUMENTS

2012/0026806 A1*  2/2012  Kwon .................. G11C 7/1078
                                                    365/189.07

FOREIGN PATENT DOCUMENTS

KR          100389919 B1     6/2003

* cited by examiner

*Primary Examiner* — Huan Hoang
(74) *Attorney, Agent, or Firm* — William Park & Associates Ltd.

(57) ABSTRACT

The invention may include a semiconductor apparatus comprising: a first die configured to latch and output external input data according to a strobe signal, to detect a valid pulse from among pulses of the strobe signal, and to generate a valid signal; and a second die configured to write data transmitted from the first die in response to the valid signal.

20 Claims, 6 Drawing Sheets tDQSS=0 tDQSS=-0.25tCK tDQSS=+0.25tCK

STACK TYPE SEMICONDUCTOR APPARATUS

CROSS-REFERENCES TO RELATED APPLICATION

The present application claims priority under 35 U.S.C. §119(a) to Korean application number 10-2014-0118848, filed on Sep. 5, 2014, in the Korean Intellectual Property Office, which is incorporated herein by reference in its entirety as set forth in full.

BACKGROUND

1. Technical Field

Various embodiments relate to a semiconductor apparatus, and more particularly, to a stack type semiconductor apparatus.

2. Related Art

When a semiconductor apparatus performs a write operation, that is, an operation for storing external input data in an internal memory area, there exists a tDQSS that is timing specification indicating a relation between a clock signal CK and a strobe signal DQS (a strobe signal according to the writing operation may be called WDQS).

A stack type semiconductor apparatus may have a structure in which a plurality of dies is stacked.

Among the plurality of dies, any one, for example, the lowest die may be configured to transmit data, commands and the like, which are inputted from an exterior, to upper dies through an interposer and the like.

The lowest die needs a domain change in a write operation. That is, the lowest die receives data in response to a strobe signal (DQS) domain and internally processes the data in response to a clock signal (CK) domain.

Therefore, in the semiconductor apparatus, circuit design should be made in consideration of the tDQSS timing margin.

SUMMARY

An embodiment of the invention may include a to semiconductor apparatus including a first die configured to latch and output external input data according to a strobe signal, to detect a valid pulse from among pulses of the strobe signal, and to generate a valid signal. The semiconductor apparatus may also include a second die configured to write data transmitted from the first die in response to the valid signal.

An embodiment of the invention may include a semiconductor apparatus that includes a first die configured to align and output external input data based on a first time domain, to detect a valid pulse among pulses of a strobe signal according the first time domain and a second time domain, and to generate a valid signal. The semiconductor apparatus may also include a second die configured to write data transmitted from the first die in response to the valid signal.

An embodiment of the invention is a semiconductor apparatus in which a plurality of dies are stacked, in which one die of the plurality of dies may be configured to transmit alignment data obtained by aligning external input data according to a strobe signal. Further, the one die of the plurality of dies may be configured to transmit a valid signal obtained by detecting a valid pulse of pulses of the strobe signal to remaining dies of the plurality of dies. The remaining dies may be configured to write the alignment data according to the valid signal.

DETAILED DESCRIPTION

Hereinafter, a stack type semiconductor apparatus according to the invention will be described in detail with reference to the accompanying figures through an embodiment. A stack type semiconductor apparatus capable of performing a data write operation independent of a strobe signal timing specification is described herein.

Figure 1:
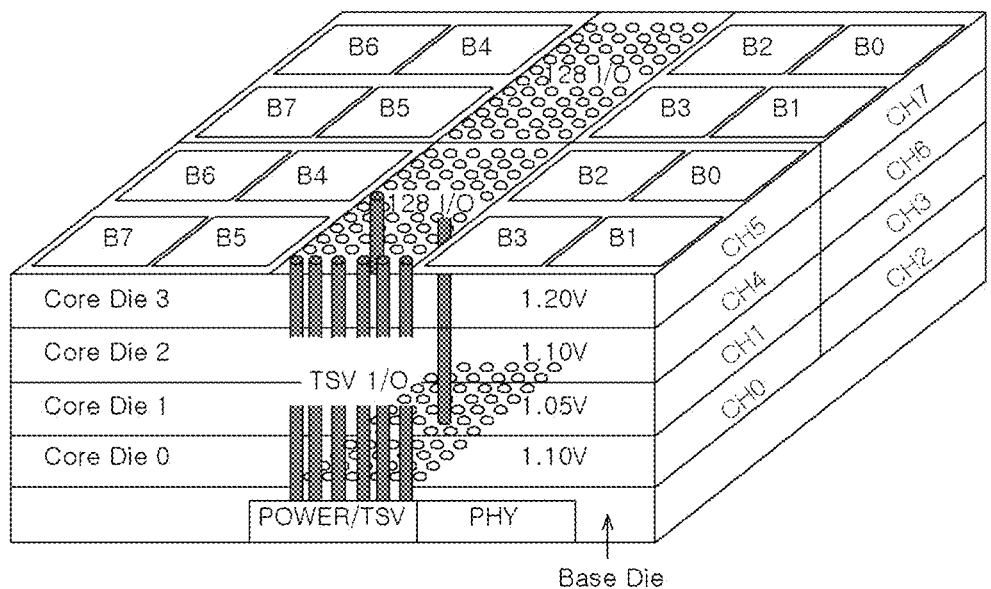
FIG. 1 is a perspective view of a semiconductor apparatus according to an embodiment.

Referring to FIG. 1, in a semiconductor apparatus according to an embodiment, a plurality of dies may be stacked.

The plurality of dies may include a base die Base Die and core dies Core Die 0 to Core Die 3.

The base die may include a PHY area and various logic circuits serving as an interface between an exterior of the semiconductor apparatus and the core dies Core Die 0 to Core Die 3.

The core dies Core Die 0 to Core Die 3 may include memory areas and circuit configurations to perform data processing.

Each core die may include a plurality of memory banks BO to B7 and an input/output logic 128 I/O.

Each core die may be divided into channels about the left and right memory banks B0 to B7 (using the left and the right for the purpose of convenience). For example, the core die Core Die 0 may be divided into channels CH0 and CH2. Further, the core die Core Die 3 may be divided into channels CH5 and CH7. Channels CH3, CH4 and CH6 are also illustrated.

The base die and the core dies Core Die 0 to Core Die 3 may be electrically coupled to each other through electrodes, for example, through-silicon vias (TSVs) such that signal transfer is performed.

Figure 2:
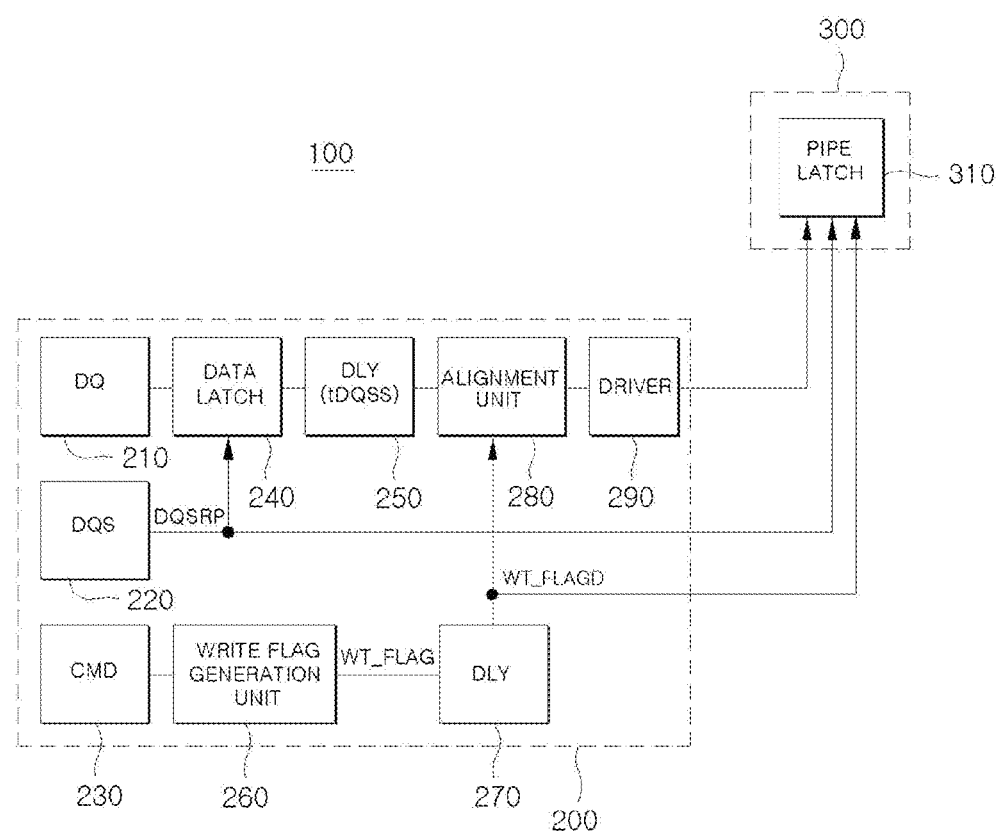
FIG. 2 is a block diagram of a semiconductor apparatus 100 according to an embodiment.

Referring to FIG. 2, a semiconductor apparatus 100 according to an embodiment may include a base die 200 and a core die 300.

A plurality of core dies 300 may be provided. In addition, FIG. 2 illustrates one core die 300 for the purpose of convenience.

The base die 200 and the core die 300 may be electrically coupled to each other through electrodes (TSVs).

The base die 200 may include first to third buffers 210, 220, and 230. The base die 200 may also include a data latch 240, a first delay unit 250, a write flag generation unit 260, a second delay unit 270, an alignment unit 280, and a driver 290.

The first buffer 210 may be configured to receive data DQ from an exterior of the semiconductor apparatus 100, such as for example, a CPU or a GPU.

The second buffer 220 may be configured to receive a strobe signal DQS from the exterior of the semiconductor apparatus 100. The second buffer may also be configured to generate a strobe pulse DQSRP.

The third buffer 230 may be configured to receive a command CMD from the exterior of the semiconductor apparatus 100.

The data latch 240 may be configured to align and output the data DQ inputted through the first buffer 210, in response to a strobe (DQS) domain, or more specifically, the strobe pulse DQSRP.

The first delay unit 250 may be configured to delay the output of the data latch 240 by a first delay time. The first delay unit 250 may also be configured to output delayed data.

The first delay time of the first delay unit 250 may be a delay time corresponding to a strobe timing specification.

The strobe timing specification may be a tDQSS that is a timing specification indicating a relation between a clock signal CK and the strobe signal DQS.

The write flag generation unit 260 may be configured to generate a write flag signal WT_FLAG in response to the clock signal CK and the output of the third buffer 230.

The write flag generation unit 260 may be configured to output a signal obtained by increasing a pulse width (0.5 tCK) of the clock signal CK to 1 tCK as the write flag signal WT_FLAG in response to the command CMD inputted through the third buffer 230.

The second delay unit 270 may be configured to delay the write flag signal WT_FLAG. Further, the second delay unit 270 may be configured to generate a delayed write flag signal WT_FLAGD.

The alignment unit 280 may be configured to align and output data outputted from the first delay unit 250, in response to a clock (CK) domain, that is, the delayed write flag signal WT_FLAGD.

The driver 290 may be configured to drive the data outputted from the alignment unit 280 to the through electrodes (TSVs).

The core die 300 may include a pipe latch 310.

The core die 300 may be configured to latch the data transmitted from the base die 200, in response to a pulse corresponding to an activation period of the delayed write flag signal WT_FLAGD of the strobe pulse DQSRP.

In the semiconductor apparatus 100 according to the aforementioned embodiment, the base die 200 aligns external input data in response to the strobe (DQS) domain. The base die 200 also compensates for the tDQSS margin and aligns the compensated data in response to the clock (CK) domain and the aligned data to the core die 300.

Consequently, the core die 300 can receive data at a timing appropriate for the tDQSS in response to the strobe pulse DQSRP and the delayed write flag signal WT_FLAGD.

Figure 3:
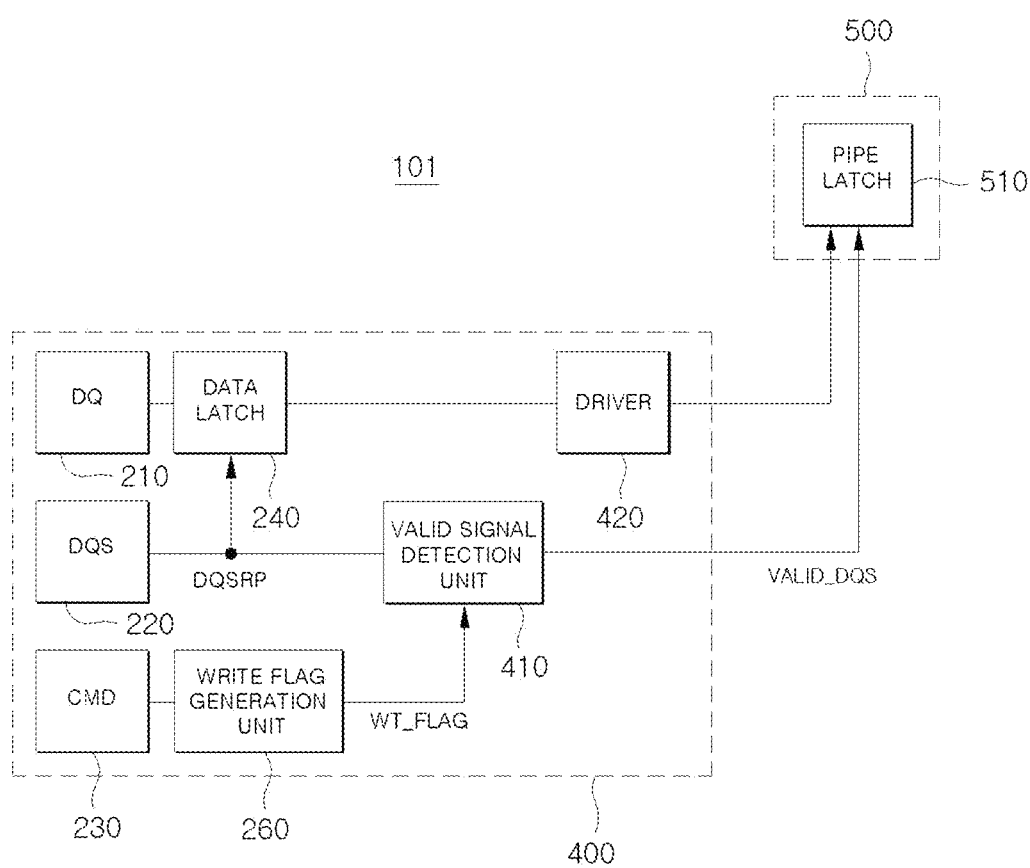
FIG. 3 is a block diagram of a semiconductor apparatus 101 is according to an embodiment.

Referring to FIG. 3, a semiconductor apparatus 101 according to an embodiment may include a base die 400 and a core die 500.

Figure 4:
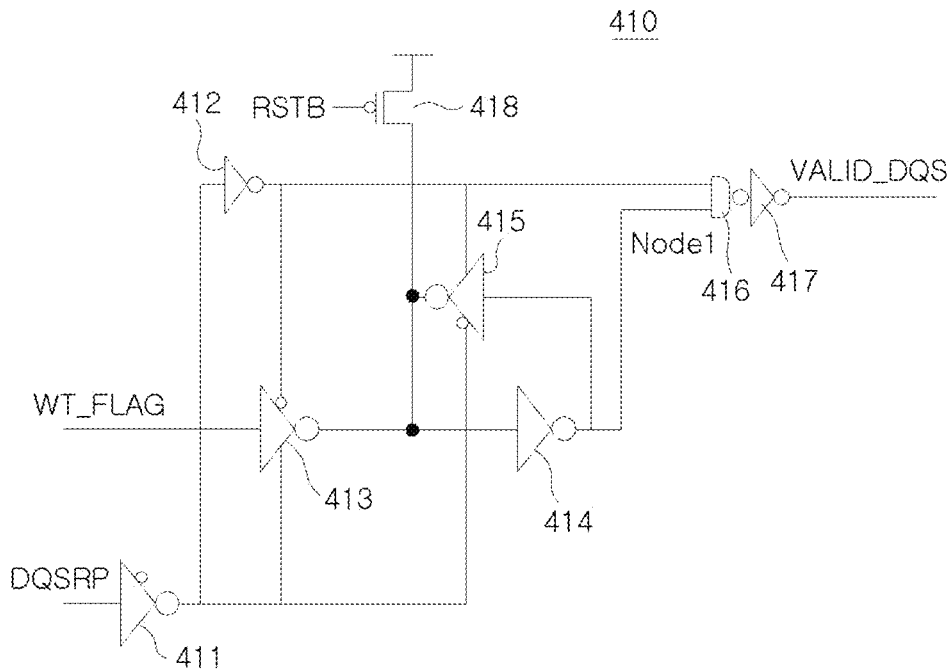
FIG. 4 is a circuit diagram of a valid period signal generation unit 410 of FIG. 3.

A plurality of core dies 500 may be provided. FIG. 4 illustrates one core die 500 for the purpose of convenience.

The core die 500 may be configured to write data in response to a valid signal VALID_DQS.

The base die 400 may be configured to align external input data based on a first time domain, that is, a strobe (DQS) domain.

The base die 400 may also be configured to transmit the aligned data to the core die 500.

The base die 400 may be configured to generate the valid signal VALID_DQS based on the strobe (DQS) domain and a second time domain, that is, a clock (CK) domain. The base die 400 may also be configured to transmit the valid signal VALID_DQS to the core die 500.

The base die 400 may be configured to latch the external input data according to the strobe signal DQS and to transmit the latched data to the core die 500.

The base die 400 may be configured to detect a valid pulse from pulses of the strobe signal DQS and also to generate the valid signal VALID_DQS.

The base die 400 and the core die 500 may be electrically coupled to each other through electrodes (TSVs).

The base die 400 may include first to third buffers 210, 220, and 230. In addition, the base die 400 may include a data latch 240, a write flag generation unit 260, a valid signal detection unit 410, and a driver 420.

The first buffer 210 may be configured to receive data DQ from an exterior of the semiconductor apparatus 101, for example, a CPU or a GPU.

The second buffer 220 may be configured to receive a strobe signal DQS from the exterior of the semiconductor apparatus 100. The second buffer 220 may also be configured to generate a strobe pulse DQSRP.

The third buffer 230 may be configured to receive a command CMD from the exterior of the semiconductor apparatus 101.

The data latch 240 may be configured to align and output the data DQ inputted through the first buffer 210, in response to the strobe (DQS) domain, or, the strobe pulse DQSRP.

The write flag generation unit 260 may be configured to generate a write flag signal WT_FLAG in response to a clock signal CK and the output of the third buffer 230.

The write flag generation unit 260 may be configured to output a signal obtained by increasing a pulse width (0.5 tCK) of the clock signal CK to 1 tCK as the write flag signal WT_FLAG in response to the command CMD inputted through the third buffer 230.

The valid signal detection unit 410 may be configured to detect a valid pulse from the strobe pulse DQSRP in response to the strobe pulse DQSRP and the write flag signal WT_FLAG. The valid signal detection unit 410 may also be configured to generate the valid signal VALID_DQS.

The driver 290 may be configured to drive the data outputted from the data latch 240 to the through electrodes (TSVs).

The core die 500 may include a pipe latch 510.

The core die 500 may be configured to latch the data transmitted from the base die 400, in response to the valid signal VALID_DQS.

Referring to FIG. 4, the valid signal detection unit 410 may be configured to latch the write flag signal WT_FLAG in response to the strobe pulse DQSRP. The valid signal detection unit 410 may also be configured to output a result, obtained by combining the latched signal with the strobe pulse DQSRP, as the valid signal VALID_DQS.

The valid signal detection unit 410 may include first to fourth inverters 411, 412, 414, and 417. The valid signal detection unit 410 may also include first and second pass gates 413 and 415, a NAND gate 416, and a transistor 418.

The first inverter 411 inverts and outputs the strobe pulse DQSRP.

The second inverter 412 inverts and outputs the output of the first inverter 411.

The first pass gate 413 allows the write flag signal WT_FLAG to pass therethrough according to the output of the first and second inverters 411 and 412.

The first pass gate 413 allows the write flag signal WT_FLAG to pass therethrough for a period wherein the strobe pulse DQSRP is at a low level.

The third inverter 414 inverts and outputs the output of the first pass gate 413.

The second pass gate 415 latches the output of the third inverter 414 according to the output of the first and second inverters 411 and 412.

The second pass gate 415 latches the output of the third inverter 414 for a period where the strobe pulse DQSRP is at a high level.

The NAND gate 416 and the fourth inverter 417 perform an AND operation on the output Node1 of the third inverter 414 and the output of the second inverter and 412. The NAND gate 416 and the fourth inverter 417 may also output a result of the AND operation as the valid signal VALID_DQS.

The transistor 418 transitions the output of the third inverter 414 to a low level in response to a reset signal RSTB. As result, the valid signal VALID_DQS is reset to a low level.

Hereinafter, the operation of the semiconductor apparatus 101 according to an embodiment will be described with reference to FIG. 5a to FIG. 5c.

It may be assumed that a write command is inputted twice.

The strobe pulse DQSRP is inputted in sequence of a pre-amble pulse Pre-amble, a valid pulse VALID, a pre-amble pulse Pre-amble, and a valid pulse VALID.

The pre-amble pulse Pre-amble after the valid pulse VALID may be a post-amble pulse Post-amble according to an input interval of the write command.

The base die 400 aligns external input data based on only the strobe (DQS) domain regardless of the clock (CK) domain. In addition, the base die 400 transmits the aligned data to the core die 500.

The write flag signal WT_FLAG corresponding to the valid pulse VALID is generated twice according to two times of the write command.

Figure 5A:
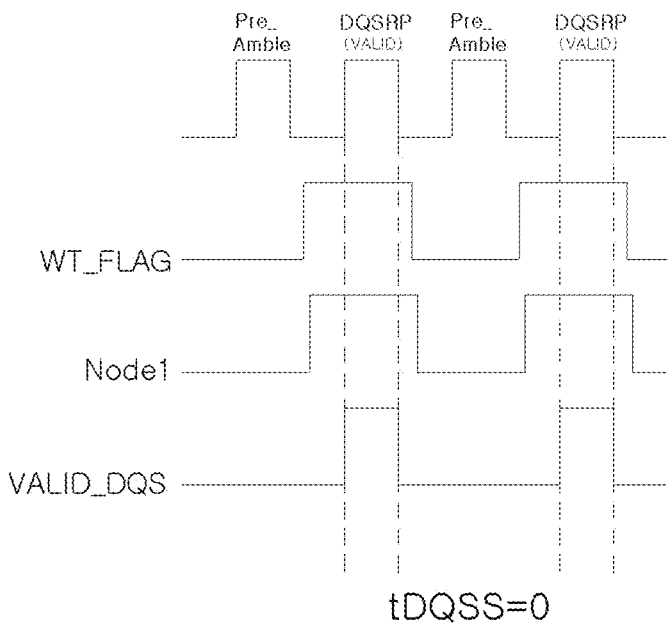
FIG. 5A to FIG. 5C are operation timing diagrams of a semiconductor apparatus 101 according to an embodiment.
Figure 5B:
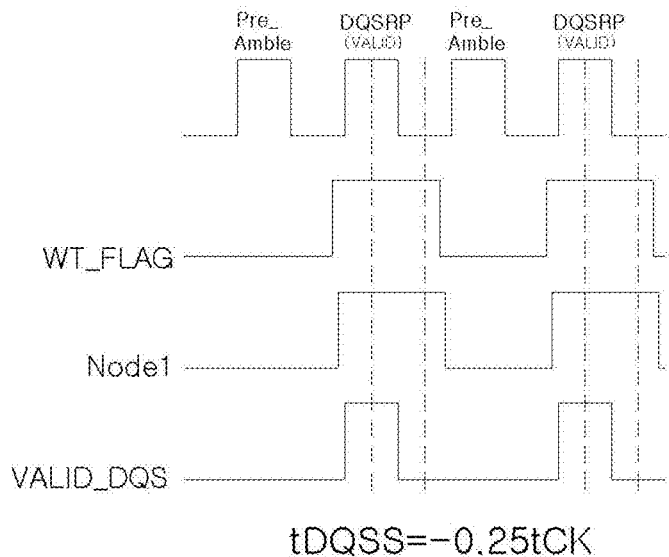
Figure 5C:
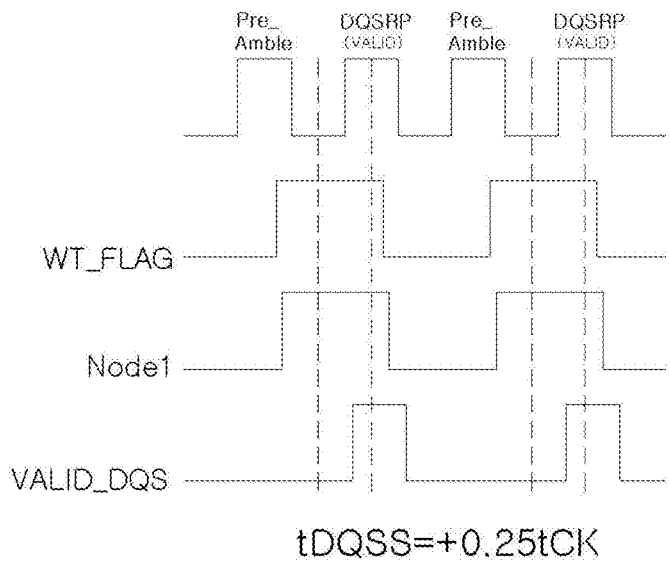

Referring to FIG. 5a to FIG. 5c, a timing skew between the valid pulse VALID and the write flag signal WT_FLAG may differ according to a tDQSS skew.

Under the condition in which the tDQSS='0' as illustrated in FIG. 5a and under the condition in which the tDQSS='−0.25 tCK' as illustrated in FIG. 5b, the valid pulse VALID may be included in an activation period, or, a high level period, of the write flag signal WT_FLAG.

However, under the condition in which the tDQSS='+0.25 tCK' as illustrated in FIG. 5c, the valid pulse VALID may deviate from the activation period of the write flag signal WT_FLAG.

The waveform of the Node 1 of the valid signal detection unit 410 of FIG. 4 is generated according to two times of the write flag signal WT_FLAG.

An activation period, or, a high level period, of the Node 1 may be generated to include all valid pulses VALID regardless of the tDQSS conditions.

In the entire strobe pulse DQSRP, pulses corresponding to the activation period of the Node 1 are outputted as the valid signal VALID_DQS.

Consequently, the core die 500 can receive accurate data in response to the valid signal VALID_DQS, regardless of the tDQSS.

According to an embodiment, a data write operation is possible independent of the tDQSS. Moreover, since the base die 400 does not need to compensate for the tDQSS margin, quick data transmission to the core die 500 is possible.

Figure 6:
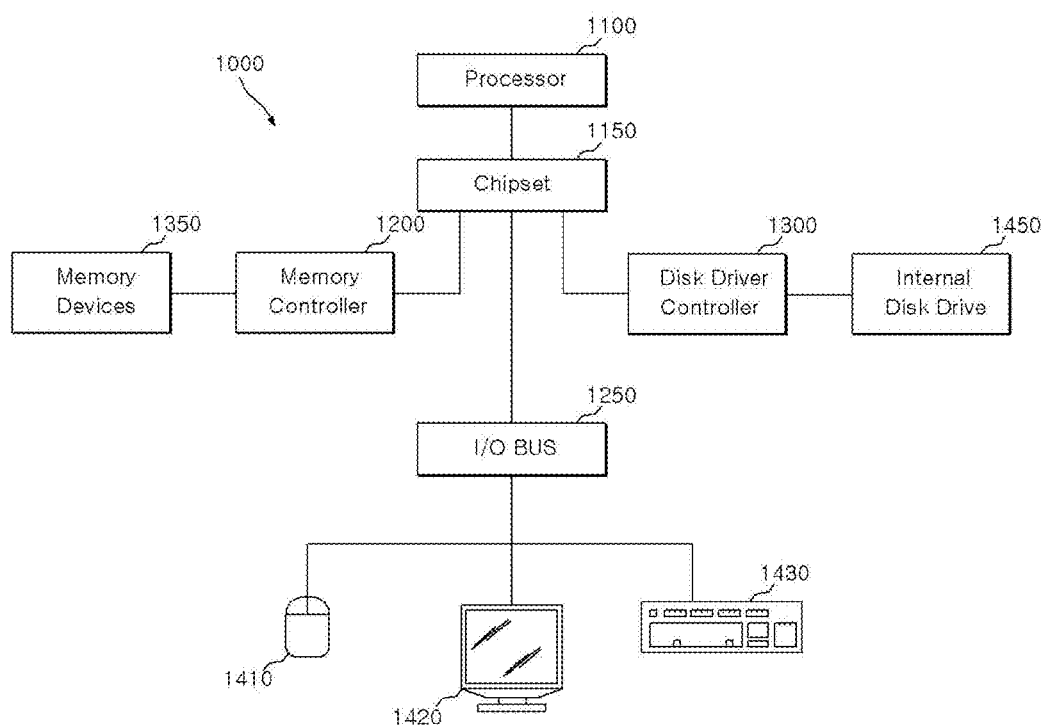
FIG. 6 illustrates a block diagram of a system employing a memory controller circuit in accordance with an embodiment of the invention.

Referring to FIG. 6, a system 1000 may include one or more processors 1100. The processor 1100 may be used individually or in combination with other processors. A chipset 1150 may be electrically coupled to the processor 1100. The chipset 1150 is a communication pathway for signals between the processor 1100 and other components of the system 1000. Other components of the system 1000 may include a memory controller 1200, an input/output ("I/O") bus 1250, and a disk drive controller 1300. Depending on the configuration of the system 1000, any one of a number of different signals may be transmitted through the chipset 1150.

The memory controller 1200 may be electrically coupled to the chipset 1150. The memory controller 1200 may be electrically coupled to one or more memory devices 1350. The memory controller 1200 can receive a request provided from the processor 1100 through the chipset 1150. The memory device 1350 may include the semiconductor apparatus described above.

The chipset 1150 may also be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420 and 1430.

The disk drive controller 1300 may also be electrically coupled to the chipset 1150. The disk drive controller 1300 may serve as the communication pathway between the chipset 1150 and one or more internal disk drives 1450. The disk drive controller 1300 and the internal disk drives 1450 may communicate with each other or with the chipset 1150 using virtually any type of communication protocol.

While certain embodiments have been described above, it will be understood to those skilled in the art that the embodiments described are examples only. Accordingly, the stack type semiconductor apparatus described should not be limited based on the described embodiments above. Rather, the stack type semiconductor apparatus described should only be limited in light of the claims that follow when taken in conjunction with the above to description and accompanying figures.

What is claimed is:

1. A semiconductor apparatus comprising:
a first die configured to latch and output external input data according to a strobe signal to detect a valid pulse from among pulses of the strobe signal, and to generate a valid signal; and
a second die configured to write data transmitted from the first die in response to the valid signal.

2. The semiconductor apparatus according to claim 1, wherein the first die comprises:
a data latch configured to align and output the external input data in response to the strobe signal;
a write flag generation unit configured to generate a write flag signal in response to a clock signal and a write command; and
a valid signal detection unit configured to detect the valid pulse from the pulses of the strobe signal in response to the strobe signal and the write flag signal, and to generate the valid signal.

3. The semiconductor apparatus according to claim 2, wherein the write flag generation unit is configured to output a signal, obtained by increasing a pulse width of the write command as the write flag signal.

4. The semiconductor apparatus according to claim 2, wherein the valid signal detection unit is configured to latch the write flag signal in response to the strobe signal, and to output a result obtained by combining a latched signal with the strobe signal as the valid signal.

5. A semiconductor apparatus comprising:
a first die configured to align and output external input data based on a first time domain, to detect a valid pulse among pulses of a strobe signal according to the first time domain and a second time domain, and to generate a valid signal; and
a second die configured to write data transmitted from the first die in response to the valid signal.

6. The semiconductor apparatus according to claim 5, is wherein the first time domain includes the strobe signal.

7. The semiconductor apparatus according to claim 5, wherein the second time domain includes a clock signal.

8. The semiconductor apparatus according to claim 5, wherein the first die comprises:
   a data latch configured to align and output the external input data in response to the strobe signal;
   a write flag generation unit configured to generate a write flag signal in response to a clock signal and a write command; and
   a valid signal detection unit configured to detect the valid pulse among the pulses of the strobe signal according to the strobe signal and the write flag signal, and to generate the valid signal.

9. The semiconductor apparatus according to claim 8, wherein the write flag generation unit is configured to output a signal obtained by increasing a pulse width of the write command as the write flag signal.

10. The semiconductor apparatus according to claim 8, wherein the valid signal detection unit is configured to latch the write flag signal in response to the strobe signal, and to output a result obtained by combining a latched signal with the strobe signal as the valid signal.

11. A semiconductor apparatus in which a plurality of dies are stacked, in which one die of the plurality of dies is configured to transmit alignment data obtained by aligning external input data according to a strobe signal, and a valid signal obtained by detecting a valid pulse from pulses of the strobe signal to remaining dies of the plurality of dies, wherein the remaining dies are configured to write the alignment data according to the valid signal.

12. The semiconductor apparatus according to claim 11, wherein the one die includes a PHY area and various logic circuits serving as an interface between an exterior of the semiconductor apparatus and the remaining dies.

13. The semiconductor apparatus according to claim 11, wherein the remaining dies include memory areas and circuit configurations for data processing.

14. The semiconductor apparatus according to claim 11, wherein the one die comprises:
   a data latch configured to align the external input data in response to the strobe signal, and to generate the alignment data;
   a write flag generation unit configured to generate a write flag signal in response to a clock signal and a write command; and
   a valid signal detection unit configured to detect the valid pulse among the pulses of the strobe signal according to the strobe signal and the write flag signal, and to generate the valid signal.

15. The semiconductor apparatus according to claim 14, wherein the write flag generation unit is configured to output a signal obtained by increasing a pulse width of the write command as the write flag signal.

16. The semiconductor apparatus according to claim 14, wherein the valid signal detection unit is configured to latch the write flag signal according to the strobe signal, and to output a result obtained by combining a latched signal with the strobe signal as the valid signal.

17. The semiconductor apparatus according to claim 11, wherein the plurality of dies are electrically coupled through electrodes.

18. The semiconductor apparatus according to claim 11, wherein the one die of the plurality of dies is configured to receive to data according to a strobe pulse and a delayed write flag signal.

19. The semiconductor apparatus according to claim 11, wherein a valid signal detection unit is configured to detect the valid pulse from a strobe pulse according to a write flag signal.

20. The semiconductor apparatus according to claim 11, wherein the valid pulse is included in an activation period of a write flag signal.

* * * * *